(12) United States Patent
Morosawa

(10) Patent No.: US 7,688,933 B2
(45) Date of Patent: Mar. 30, 2010

(54) SHIFT REGISTER CIRCUIT AND DISPLAY DRIVE DEVICE

(75) Inventor: Katsuhiko Morosawa, Tachikawa (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 11/657,758

(22) Filed: Jan. 25, 2007

(65) Prior Publication Data

US 2007/0171179 A1 Jul. 26, 2007

(30) Foreign Application Priority Data

Jan. 26, 2006 (JP) ............................. 2006-017563

(51) Int. Cl.
*G11C 19/00* (2006.01)
(52) U.S. Cl. ............................. 377/64; 377/68; 377/70; 377/73
(58) Field of Classification Search .................. 377/64, 377/68, 69, 66, 73–74
See application file for complete search history.

(56) References Cited

U.S. PATENT DOCUMENTS

| | | | |
|---|---|---|---|
| 5,166,960 A | 11/1992 | Da Costa | |
| 5,222,082 A | 6/1993 | Plus | |
| 7,145,545 B2 * | 12/2006 | Zebedee et al. | 345/100 |
| 2004/0227718 A1 | 11/2004 | Park | |
| 2005/0008114 A1 | 1/2005 | Moon | |
| 2005/0156859 A1 * | 7/2005 | Jang et al. | 345/100 |
| 2005/0220262 A1 | 10/2005 | Moon | |
| 2006/0146978 A1 * | 7/2006 | Jang | 377/64 |
| 2006/0210012 A1 * | 9/2006 | Yamaguchi et al. | 377/64 |
| 2007/0019775 A1 * | 1/2007 | Tsai et al. | 377/64 |

FOREIGN PATENT DOCUMENTS

| | | |
|---|---|---|
| JP | 2001-350438 A | 12/2001 |
| JP | 2002-197885 A | 7/2002 |
| KR | 2003-79693 A | 10/2003 |

(Continued)

OTHER PUBLICATIONS

The International Search Report and the Written Opinion of the International Searching Authority dated May 23, 2007 for PCT/JP2007/051655 filed Jan. 25, 2007, 15 sheets.

(Continued)

*Primary Examiner*—Tuan Lam
(74) *Attorney, Agent, or Firm*—Frishauf, Holtz, Goodman & Chick, P.C.

(57) ABSTRACT

A shift register circuit includes plural stages of signal holding circuits which are cascade-connected to hold a signal based on a supplied input signal, to output an output signal based on the held signal, and to supply the output signal as an input signal to a subsequent stage. Each of the plural stages of signal holding circuits includes an output circuit which is supplied with two types of clock signals consisting of a first clock signal and a second clock signal. A timing of the second clock signal is delayed by a predetermined delay time with respect to a timing of applying the input signal, which is supplied with a signal at a timing delayed by the delay time of the second clock signal from the timing of applying the input signal, and which outputs the output signal at a timing responsive to the first clock signal.

30 Claims, 9 Drawing Sheets

FOREIGN PATENT DOCUMENTS

KR   2005-96568 A   10/2005

OTHER PUBLICATIONS

Bogart, Theodore F, Jr., University of Southern Mississippi, "Introduction to Digital Circuits," 1992, Mc-Graw-Hill, Singapore 819941, XP00243291, pp. 399-401.

Korean Office Action dated Jan. 21, 2009 (7 pages), and English translation thereof (8 pages), issued in a counterpart Korean Application No. 10-2007-7028000.

Taiwanese Office Action dated Aug. 31, 2009 and English translation thereof issued in a counterpart Taiwanese Application No. 096102811.

Japanese Office Action dated Oct. 27, 2009 (4 pages), and English translation thereof (5 pages), issued in counterpart Japanese Application Serial No. 2006-017563.

* cited by examiner

US 7,688,933 B2

SHIFT REGISTER CIRCUIT AND DISPLAY DRIVE DEVICE

CROSS-REFERENCE TO RELATED APPLICATIONS

This application is based upon and claims the benefit of priority from prior Japanese Patent Application No. 2006-017563, filed Jan. 26, 2006, the entire contents of which are incorporated herein by reference.

BACKGROUND OF THE INVENTION

1. Field of the Invention

The present invention relates to a shift register circuit and a display drive device comprising the circuit, and particularly to a shift register circuit and a display drive device that are well applied to a drive circuit of a display device such as a liquid crystal display device.

2. Description of the Related Art

In recent years, there has been remarkable prevalence of information equipment such as a computer, a cellular phone, or a personal digital assistant (PDA) and an image processing related equipment such as a digital video camera, a digital still camera, or a scanner. In such equipment, a liquid crystal display (LCD) is frequently used as display means.

For example, an active matrix liquid crystal display device is configured as follows. Display pixels (liquid crystal pixels) equipped with pixel transistors such as thin film transistors are arranged in a matrix shape. Scanning lines are sequentially established in an active state by means of a gate driver with respect to a display panel equipped with scanning lines for connecting display pixels in a row direction and data lines for connecting them in a columnar direction. A predetermined signal voltage is applied to each of the data lines by means of a source driver; and then, a signal voltage according to image information is written into display pixels established in an active state, thereby controlling an alignment state of liquid crystals in the display pixels so as to display desired image information at a predetermined contrast. Here, for example, in the gate driver, a shift register circuit is provided as a constituent element for sequentially outputting scan signals for establishing scanning lines in an active state. In addition, a shift register circuit for setting a timing of sampling and acquiring display data to be supplied, in association with data lines is provided in the source driver.

FIG. 8A is a circuit diagram showing an exemplary construction of a conventional shift register circuit.

FIG. 8B is a timing chart for explaining an operation of the shift register of FIG. 8A.

FIG. 9A is a circuit diagram showing a construction of a signal holding section that configures the conventional shift register.

FIG. 9B is a timing chart for explaining an operation of the signal holding section of FIG. 8A.

The shift register circuit, as shown in FIG. 8A, is constructed such that a plurality (plural stages) of signal holding sections are cascade-connected in series. Then, the signals held in the signal holding sections are externally outputted as an output signal OUTn and are sequentially transferred (shifted) to signal holding sections of a subsequent stage.

Each of the signal holding sections, as shown in FIG. 8A, is configured by a combination of a set/reset type flip flop FFn and a push/pull circuit composed of two MOS transistors T1n and T2n (n=1, 2, 3, 4, . . . ).

That is, connection is established such that an input signal IN is supplied to a set signal input terminal S of the flip flop FFn and a reset signal RST is supplied to a reset signal input terminal R. In addition, the first and second MOS transistors T1n and T2n that configure the push/pull circuit are connected in series between a terminal applied with a predetermined clock signal CK and a power supply terminal applied with a low electric potential power supply Vss. A gate electrode of the first MOS transistor T1n is connected to an output terminal Q of the flip flop FFn, and a gate electrode of the second MOS transistor T2n is connected to an inverted output terminal $\overline{Q}$ of the flip flop FFn. Then, an output signal OUT is outputted from a connection contact between both of the MOS transistors T1n and T2n.

In the thus constructed signal holding section, as shown in the timing chart of FIG. 8B, when the input signal IN supplied to the set signal input terminal S of the flip flop FFn is obtained at a high level, the flip flop FFn is set; a high level signal is outputted from the output terminal Q thereof and a low level signal is outputted from the inverted output terminal $\overline{Q}$. The state of the output signal of this flip flop FFn is maintained even if the input signal reverts to a low level.

Then, when a reset signal RST supplied to the reset signal input terminal R is obtained at a high level, the signal is reset, a low level signal is outputted from the output terminal Q of the flip flop FFn, and then, a high level signal is outputted from the inverted output terminal $\overline{Q}$.

When a high level signal is thus outputted from the output terminal Q of the flip flop FFn in accordance with the high level of the input signal IN, a high level voltage is applied to a gate electrode of the first MOS transistor T1n of the push/pull circuit, and then, the first MOS transistor T1n is turned ON. In addition, at this time, a low level signal is outputted from the inverted output terminal $\overline{Q}$ of the flip flop FFn. Thus, a low level voltage is applied to the gate electrode of the second MOS transistor T2n of the push/pull circuit, and then, the second MOS transistor T2n is turned OFF. At this time, when a high level pulse signal CK is supplied to the push/pull circuit, an output signal OUT is obtained at a high level.

Then, when the reset signal RST is obtained at a high level, a low level signal and a high level signal are outputted from the output terminal Q and the inverted output terminal $\overline{Q}$, respectively, of the flip flop FFn. In this manner, the first MOS transistor T1n is turned OFF, and then, the second MOS transistor T2n is turned ON. Therefore, the output signal OUT is obtained at a low level.

The shift register circuit, as shown in FIG. 8A, is constructed by cascade-connecting a plurality of the signal holding sections having the above construction in series. That is, an output signal OUTn is acquired from a push/pull circuit of a signal holding section of the n-th stage and the resulting signal is supplied to a set terminal S of a flip flop FFn+1 of a signal holding section of the n+1-th stage. Connection to the reset terminal R of the flip flop FFn of the signal holding section of the n-th stage is established so as to feed back an output signal OUTn+1 from the signal holding section of the n+1-th stage. Here, a predetermined start signal ST is supplied to the set terminal S of the flip flop FFn of a signal holding section of a first stage. In addition, a reset signal is externally supplied to the reset terminal R of a flip flop FFn of a signal holding section of a final stage. Then, a first pulse signal CK1 is supplied to a push/pull circuit of a signal holding section of an odd-numbered stage and a second pulse signal CK2 having an inverted waveform of the first pulse signal CK1 is supplied to a push/pull circuit of a signal holding section of an even-numbered stage.

According to the thus constructed shift register circuit, as shown in the timing chart of FIG. 8B, after the start signal ST has been supplied, high level output signals OUT1, OUT2, OUT3, OUT4, . . . are sequentially transferred (shifted), and then outputted in synchronism with a high level applying timing of the pulse signals CK1 and CK2. Therefore, for example, when scan signals based on these output signals OUT1, OUT2, OUT3, OUT4, . . . are sequentially applied to scan lines of the liquid crystal display device, a line sequential selection operation can be made such that the display pixels connected to the scan lines are established in an active state on a row by row basis.

The first MOS transistor T1$n$ of the push/pull circuit in this signal holding section plays an important role in signal output and transfer to a next stage. That is, it is no exaggeration to say that the characteristics of this first MOS transistor T1$n$ determine the performance of the whole shift register circuit.

On the other hand, it has been researched and developed that drive circuits such as a gate driver and a source driver in an active matrix liquid crystal display device are integrally formed on a display panel substrate (TFT substrate) by means of thin film transistors made of amorphous silicon (a-Si) or poly-silicon (p-Si), thereby promoting reduction in cost and thickness of the display device. In particular, amorphous silicon is advantageous in cost reduction because it can be formed at the same time when TFT configuring pixels is formed.

However, in the case where the signal holding section as described above is composed of MOS transistors made of amorphous silicon TFTs or poly-silicon TFTs, it is experimentally known that, in such MOS transistors, threshold value characteristics vary due to eccentricity of positive and negative polarities of a time integral value (or integrated voltage) of a signal level applied to a gate electrode, whereby a change with time at which an ON current is lowered is comparatively great with respect to transistors made of single-crystal silicon. Therefore, in the case where the shift register circuit is constructed using such MOS transistors, in particular, the characteristics of the first MOS transistor T1$n$ of the push/pull circuit that plays an important role in signal output and transfer to a next stage deteriorates with time; the signal level of the output signal OUT is lowered with time; a switching operation of each transistor is not properly made; and a malfunction of the shift register circuit or deterioration of operational characteristics may occur.

BRIEF SUMMARY OF THE INVENTION

In a shift register circuit and a display drive device comprising the circuit according to the present invention, variation of the characteristics of transistors responsible for signal output and transfer to a next stage is suppressed, thereby advantageously making it possible to improve long-term reliability of the shift register circuit and the display drive device comprising the circuit.

In order to achieve the above-described advantage, a first shift register circuit according to the present invention comprises: plural stages of signal holding circuits which are cascade-connected to hold a signal based on a supplied input signal, to output an output signal based on the held signal based on the supplied input signal, and to supply the output signal as an input signal to a subsequent stage; each of the plural stages of signal holding circuits comprising: an output circuit which is supplied with two types of clock signals consisting of a first clock signal and a second clock signal, a timing of the second clock signal is delayed by a predetermined delay time with respect to a timing of applying the input signal, which is supplied with a signal at a timing delayed by the delay time of the second clock signal from the timing of applying the input signal, and which outputs the output signal at a timing responsive to the first clock signal.

In order to achieve the above-described advantage, a second shift register circuit according to the present invention comprises: plural stages of signal holding circuits which are supplied with an input signal, and are cascade-connected to output an output signal based on the input signal and to supply the output signal as an input signal to a subsequent stage, wherein each of the plural stages of signal holding circuits is supplied with two types of clock signals consisting of a first clock signal and a second clock signal, a timing of the second clock signal is delayed by a predetermined delay time with respect to a timing of applying the input signal, and a reset signal, and comprises: a latch circuit which holds the input signal at a timing delayed by the delay time in response to the second clock signal and resets the held signal in response to the reset signal; and an output circuit which outputs the held signal as the output signal at a timing responsive to the first clock signal.

In order to achieve the above-described advantage, a third shift register circuit according to the present invention comprises: plural stages of signal holding circuits which are supplied with an input signal, and are cascade-connected to output an output signal based on the input signal and to supply the output signal as an input signal to a subsequent stage, wherein each of the plural stages of signal holding circuits is supplied with two types of clock signals consisting of a first clock signal and a second clock signal a timing of the second clock signal is delayed by a predetermined delay time with respect to a timing of applying the input signal, and a reset signal, and comprises: a latch circuit which holds the input signal and resets the held signal in response to the reset signal; and an output circuit which outputs the held signal as the output signal at a timing delayed by the delay time in response to the second clock signal.

In order to achieve the above-described advantage, there is provided a display drive device which outputs a signal for displaying a desired image to a display panel having a plurality of display pixels in a matrix shape, the display drive device comprising a shift register circuit which sequentially outputs control signals for outputting the signal, wherein the shift register circuit comprises plural stages of signal holding circuits which are cascade-connected to hold a signal based on a supplied input signal, to output an output signal based on the held signal, and to supply the output signal as an input signal to a subsequent stage, and each of the plural stages of signal holding circuits comprises an output circuit which is supplied with two types of clock signals consisting of a first clock signal and a second clock signal, a timing of the second clock signal is delayed by a predetermined delay time with respect to a timing of applying the input signal, which is supplied with a signal at a timing delayed by the delay time of the second clock signal from the timing of applying the input signal, and which outputs the output signal at a timing responsive to the first clock signal.

DETAILED DESCRIPTION OF THE INVENTION

Now, a shift register circuit and a display drive device comprising the circuit according to the present invention will be described in detail by way of embodiments shown in the accompanying drawings.

While various limitations technically preferable in order to carry out the present invention are applied to the embodiments described below, it does not imply that the scope of the invention is limited to the following embodiments and illustrative examples.

Figure 1A:
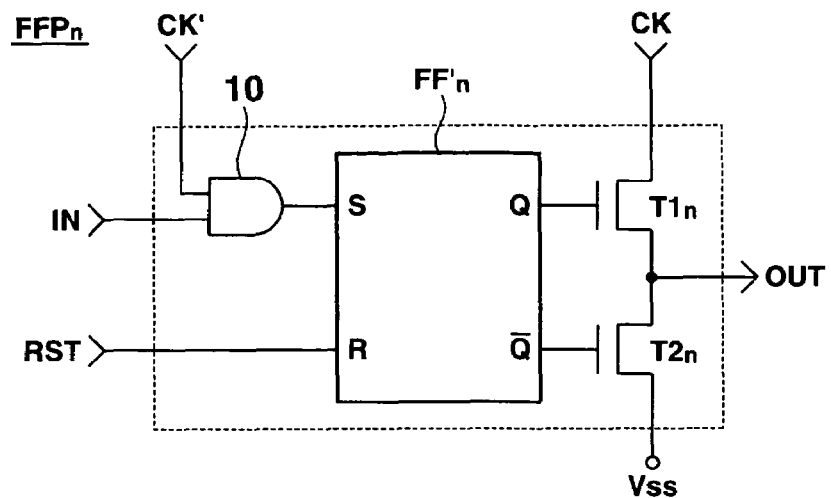
FIG. 1A is a block diagram depicting an exemplary construction of one embodiment of a signal holding section that configures a shift register circuit according to the present invention.

FIG. 1A is a block diagram depicting an exemplary construction of one embodiment of a signal holding section that configures a shift register circuit according to the present invention.

Figure 1B:
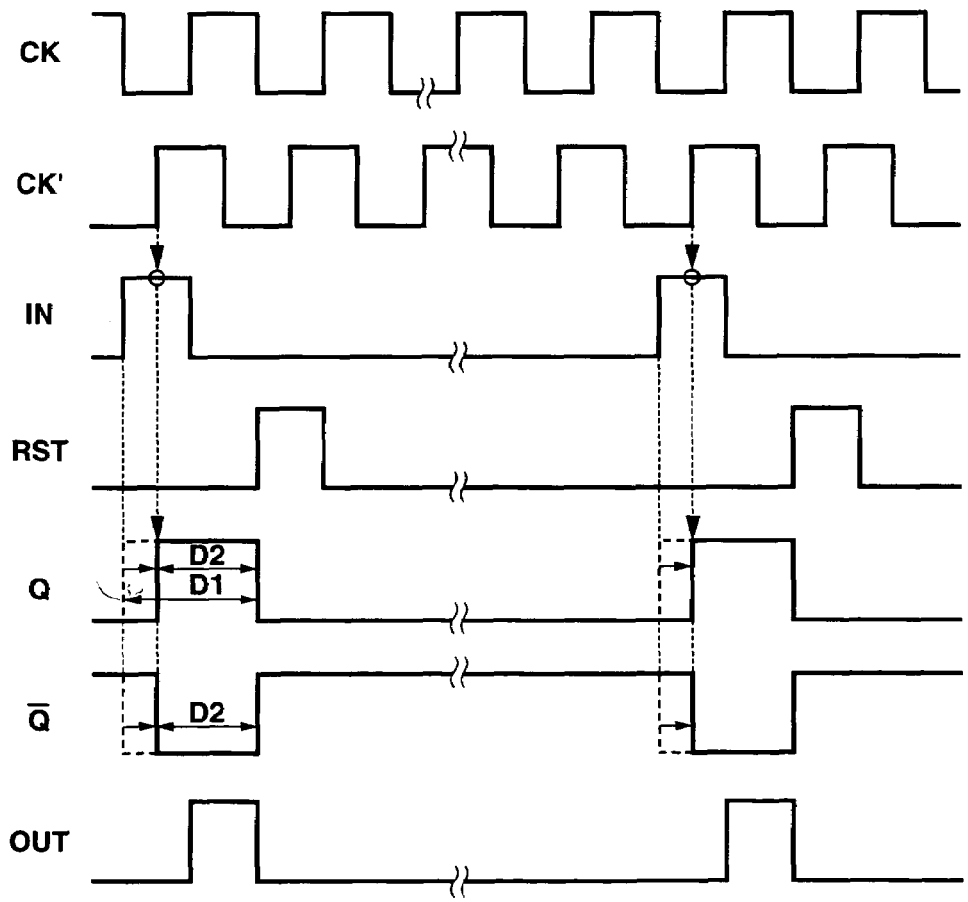
FIG. 1B is a timing chart for explaining an operation of the signal holding section of FIG. 1A.

FIG. 1B is a timing chart for explaining an operation of the signal holding section of FIG. 1A.

Figure 2:
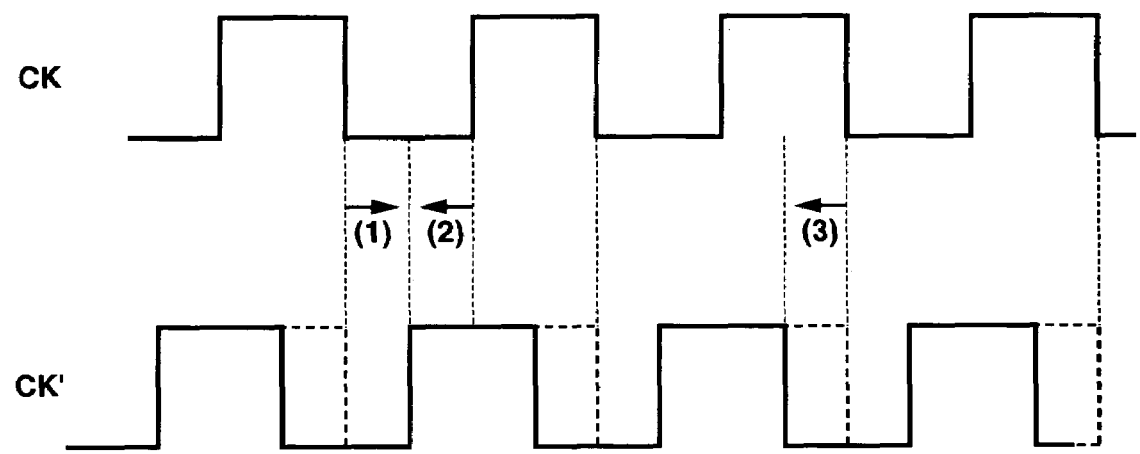
FIG. 2 is a timing chart for explaining a relationship in timing between an output clock signal and a drive clock signal, which are supplied to the signal holding section in the present embodiment.

FIG. 2 is a timing chart for explaining a relationship in timing between an output clock signal (first clock signal) and a drive clock signal (second clock signal), which are supplied to the signal holding section in the present embodiment.

The shift register circuit in the present invention, as shown in FIG. 4 described later, has a construction such that a plurality (plural stages) of signal holding sections (signal holding circuits) FFPn shown in FIG. 1A are cascade-connected in series. As in a conventional shift register circuit, the signals held in the signal holding sections are externally outputted as output signals, and then sequentially transferred (shifted) as input signals to signal holding sections of a later stage.

Each of the signal holding sections FFPn that configure the shift register circuit in the present invention, as shown in FIG. 1A, is configured by a combination of, for example, a set/reset type flip flop FF'n, two input AND circuits 10, and a push/pull circuit composed of a first MOS transistor (first transistor) T1n and a second MOS transistor (second transistor) T2n (n=1, 2, 3, 4, . . . ). This push/pull circuit forms an output circuit in the present invention.

Then, connection is established such that an input signal IN is supplied to one signal input terminal (first signal input terminal) of the AND circuit 10, a drive clock signal (second clock signal) CK' is supplied to the other signal input terminal (second clock signal input terminal), and then, an output of the AND circuit 10 is supplied to a set signal input terminal S of the flip flop FF'n. In addition, connection is established such that a reset signal RST is supplied to a reset signal input terminal (second signal input terminal) R of the flip flop FF'n.

The first and second MOS transistors T1n and T2n that configure the push/pull circuit are connected in series between a terminal (first clock signal input terminal) applied with an output clock signal (first clock signal) whose timing is different from that of the drive clock signal (second clock signal) CK' and a power supply terminal applied with a low electric potential power supply Vss. Then, a gate electrode of the first MOS transistor T1n is connected to an output terminal Q of the flip flop FF'n, and a gate electrode of the second MOS transistor T2n is connected to an inverted output terminal $\overline{Q}$ of the flip flop FF'n. Then, a connection contact between the MOS transistors T1a and T2n serves as an output terminal, and then, an output signal OUT is outputted therefrom.

Now, an operation of the signal holding section FFPn in the present embodiment will be described with reference to the timing chart of FIG. 1B.

First, a high level input signal IN is supplied to one signal input terminal (first signal input terminal) of the AND circuit 10. At this time, a drive clock signal (second clock signal) CK' supplied to the other signal input terminal (second clock signal input terminal) of the AND circuit 10 is obtained at a low level. Thus, an output of the AND circuit 10 is also obtained at a low level. In this manner, the low level signal is supplied to the set signal input terminal S of the flip flop FF'n, and thus, the flip flop FF'n is not set at this time. A low level signal is outputted from the output terminal Q thereof and a high level signal is outputted from the inverted output terminal $\overline{Q}$.

Then, if the drive clock signal CK' rises and is obtained at a high level while an input signal IN is obtained at a high level, the output of the AND circuit 10 is also obtained at a high level. In this way, a high level signal is supplied to the set signal input terminal S of the flip flop FF'n, and then, the flip flop FF'n is set. Therefore, a high level signal is outputted from the output terminal Q of the lip flop FF'n and a low level signal is outputted from the inverted output terminal $\overline{Q}$. The states of the signals outputted from the output terminals Q and $\overline{Q}$ of this flip flop FF'n are maintained even if the input signal IN or the drive clock signal CK' reverts to a low level. In this manner, a high level voltage is applied to a gate electrode of the first MOS transistor T1n of the push/pull circuit and a low level voltage is applied to a gate electrode of the second MOS transistor T2n. Therefore, the first MOS transistor T1n is turned ON, and then, the second MOS transistor is turned OFF. At this time, in the first and second MOS transistors T1n and T2n of the push/pull circuit, an output clock signal (first clock signal) CK is supplied to a drain electrode (first clock signal input terminal) of the first MOS transistor T1, and a low electric potential power supply Vss is applied to a source electrode of the second MOS transistor T2n. Thus, an output signal OUT taken out from an output terminal at a connection point between the MOS transistors T1n and T2n is obtained as a signal whose level is responsive to an output clock signal CK. That is, while the output clock signal CK is obtained at a low level, the output signal OUT is obtained at a low level. When the output clock signal CK is obtained at a high level, the output signal OUT is also obtained at a high level.

Then, when a high level reset signal RST is supplied to a reset signal input terminal (second signal input terminal) R, the flip flop FF'n is reset, and a low level signal is outputted from the output terminal Q thereof, and a high level signal is outputted from the inverted output terminal $\overline{Q}$. In this way, the first MOS transistor T1$n$ of the push/pull circuit is turned OFF, the second MOS transistor T2$n$ is turned ON, and then, the output signal OUT from the output terminal is obtained at a low level.

Figure 8A:
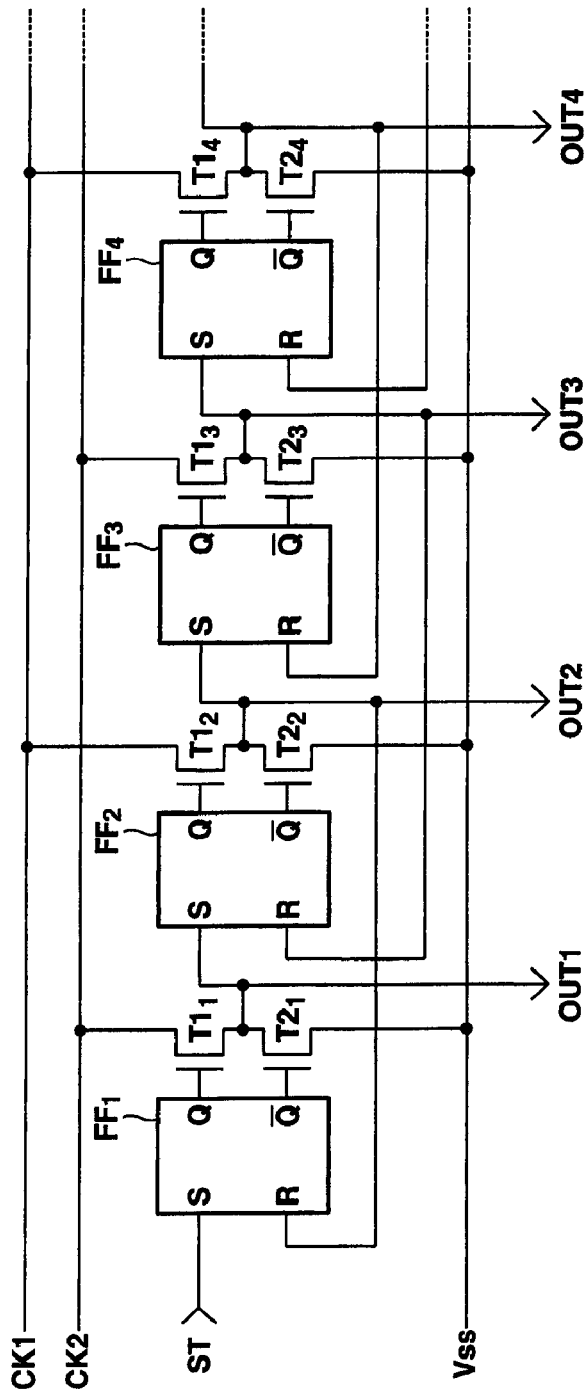
FIG. 8A is a circuit diagram showing an exemplary construction of a conventional shift register circuit.
Figure 8B:
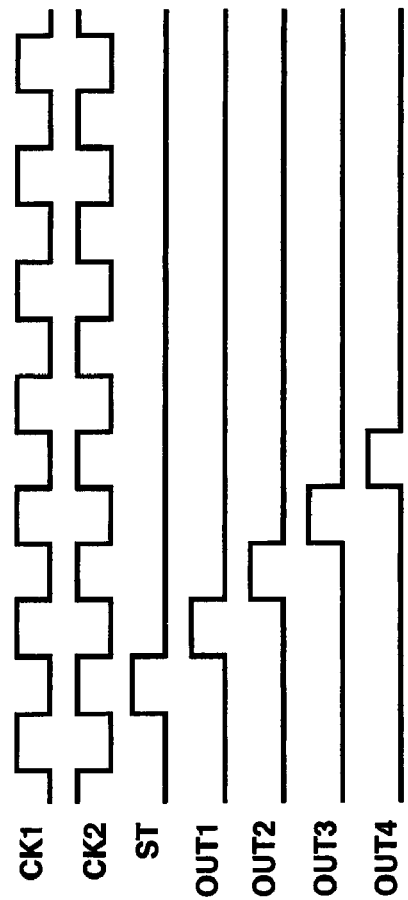
FIG. 8B is a timing chart for explaining an operation of the shift register circuit of FIG. 8A.
Figure 9A:
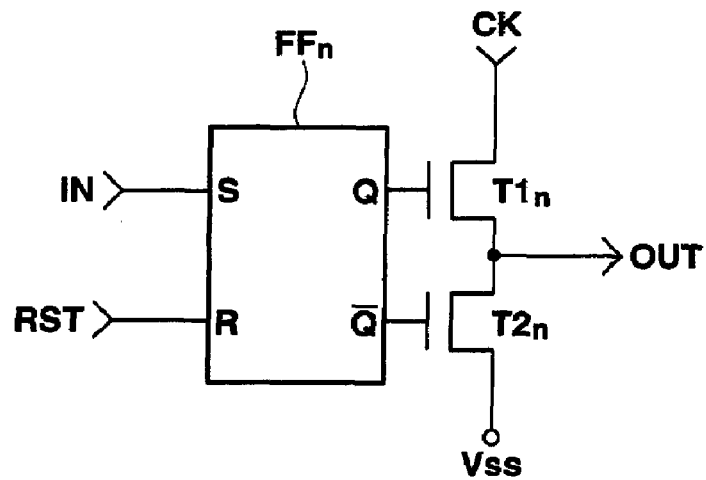
FIG. 9A is a circuit diagram showing a construction of a signal holding section that configures the conventional shift register circuit.
Figure 9B:
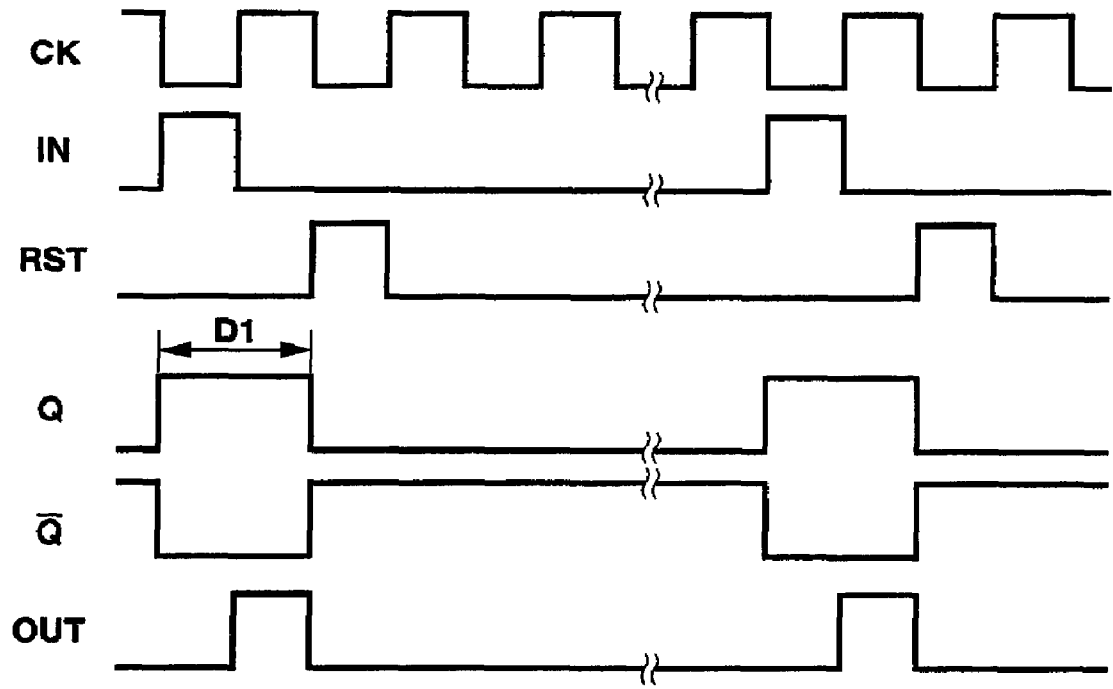
FIG. 9B is a timing chart for explaining an operation of the signal holding section of FIG. 8A.

As described above, the signal holding section FFPn in the present embodiment is constructed such that, another clock signal (drive clock signal CK': second clock signal) is used as a clock signal in addition to an output clock signal (first clock signal) CK, and when an input signal IN and the drive clock signal CK' each are obtained at a high level, the first MOS transistor T1$n$ of the push/pull circuit is turned ON. In addition, a timing at which the drive clock signal CK' is obtained at a high level is delayed more significantly than a timing at which the input signal IN is obtained at a high level, whereby, as indicated as D2 in FIG. 1B, a time for which a voltage is applied to a gate electrode of the first MOS transistor T1$n$ of the push/pull circuit can be set at a time D2 that is shorter than the conventional time D1 shown in FIG. 8B. For the sake of comparison, D1 in FIG. 8B has been described in FIG. 1B as well. In this manner, a voltage stress applied to the gate electrode can be reduced, which is a main factor of deterioration with time in the case of using amorphous silicon TFT, and then, deterioration of the first MOS transistor T1$n$ of the push/pull circuit can be suppressed.

Referring now to FIG. 2, a description will be given with respect to a relationship in timing required between the output clock signal (first clock signal) CK and drive clock signal (second clock signal) CK' described above.

As has been described above, in the signal holding section FFPn and the shift register circuit comprising this section, a timing at which the drive clock signal CK' is obtained at a high level is delayed more significantly than a timing at which the input signal IN is obtained at a high level, whereby a time for which a voltage is applied to a gate electrode of a first MOS transistor T1$n$ of a push/pull circuit is reduced compared with that of the conventional construction. In addition, the input signal IN is obtained as an output signal of a signal holding section FFPn of a front stage at a second or subsequent stage, in a shift register circuit, and is obtained as a signal responsive to a timing of an output clock signal CK. That is, as shown in FIG. 1A, the input signal IN is obtained as a high level signal at a timing at which the clock signal CK is obtained at a low level, and is obtained as a low level signal at a timing at which the output clock signal CK is obtained as a high level.

Therefore, as shown in ① of FIG. 2, a timing at which the drive clock signal CK' rises needs to be later than a timing at which the output clock signal CK falls. In addition, as shown in ② of the figure, the above timing needs to be earlier than a timing at which the output clock signal CK rises.

In addition, a timing at which a flip flop FF'n is reset, a low level signal is outputted from an output terminal Q, and a high level signal is outputted from an inverted output terminal $\overline{Q}$ is determined depending on a timing at which a high level reset signal RST is supplied to a reset signal input terminal R. The above timing is not relevant to a timing at which the drive clock signal CK' falls. Therefore, the timing at which the drive clock signal CK1 falls may be identical to or earlier than a timing at which the output clock signal CK falls. That is, the time indicated by ③ shown in FIG. 2 may be zero. That is, in FIGS. 1A and 2, while drive clock signal CK' has a waveform whose duty ratio is equal to that of the output clock signal CK and whose phase is different therefrom, the drive clock signal CK' may not have a duty ratio equal to that of the output clock signal CK as long as the rise timing meets the condition described above. For example, as indicated by the dashed line in FIG. 2, the drive clock signal CK' may be produced as a waveform whose duty ratio is different from that of the output clock signal CK and whose fall timing is identical to a timing at which the output clock signal CK falls.

In FIG. 1A, while the signal holding section FFPn is composed of a combination of a set/reset type flip flop FF'n and two input AND circuits 10 each provided at the side of a set signal input terminal S of the flip flop FF'n, and a push/pull circuit, this holding section may have other constituent elements as long as it functions in the same manner as the above.

Figure 3A:
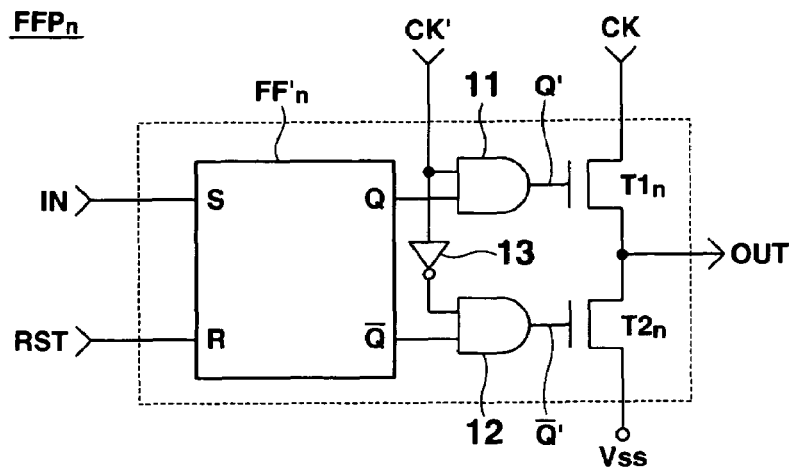
FIG. 3A is a block diagram depicting another exemplary configuration of one embodiment of a signal holding section that configures the shift register circuit according to the present invention.

FIG. 3A is a block diagram depicting another exemplary configuration of one embodiment of a signal holding section that configures the shift register circuit according to the present invention.

Figure 3B:
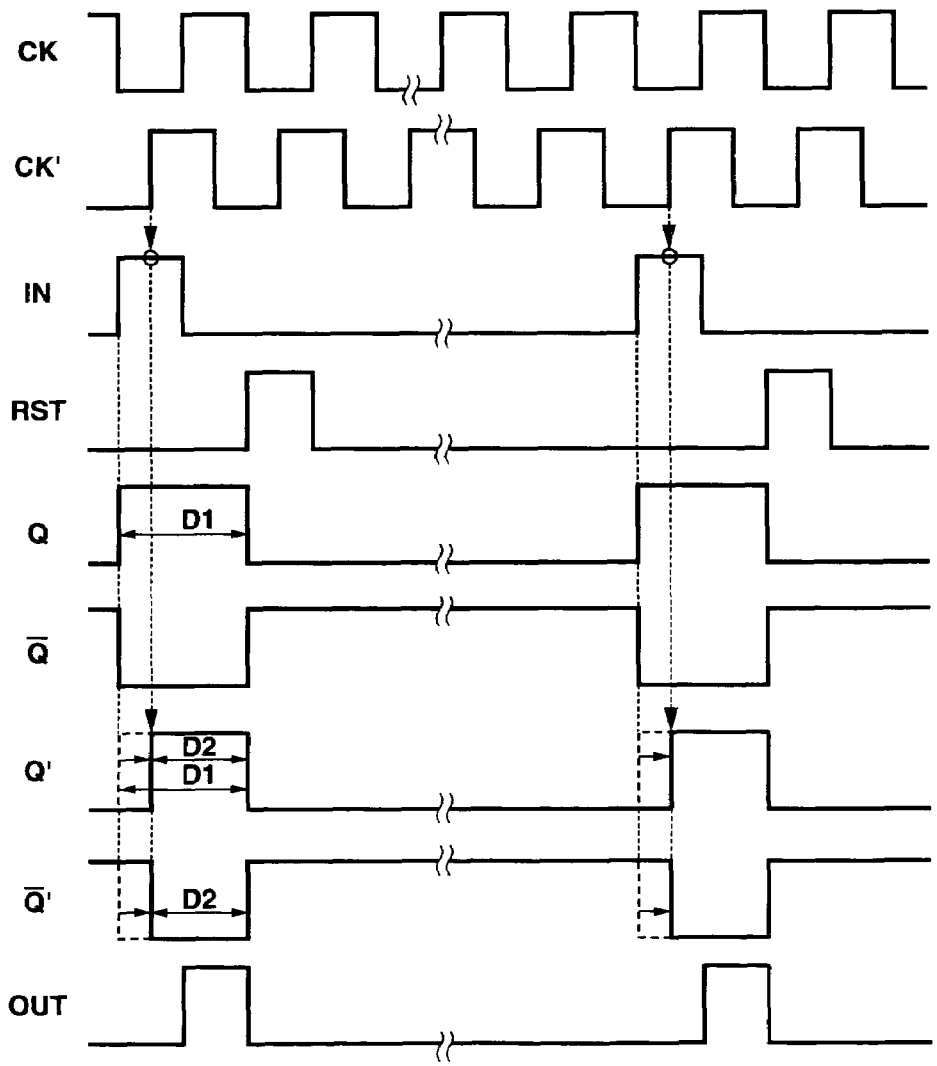
FIG. 3B is a timing chart for explaining an operation of the signal holding section of FIG. 3A.

FIG. 3B is a timing chart for explaining an operation of the signal holding section of FIG. 3A.

With respect to like constituent elements shown in FIGS. 1A and 1B, a brief description will be given or a description is omitted.

The signal holding section FFPn in this exemplary construction, as shown in FIG. 3A, is configured by a combination of: a set/reset type flip flop FF'n; two input AND circuits 11 each provided at an output terminal Q side of the flip flop FF'n; two input AND circuits 12 each provided at an inverted output terminal $\overline{Q}$ side; an inverter circuit (inverter) 13 provided between the 2-input AND circuits 11 and 12; and a push/pull circuit composed of a first MOS transistor T1$n$ and a second MOS transistor T2$n$.

Connection is established such that an input signal IN is supplied to a set signal input terminal S of the flip flop FF'n, and a reset signal RST is supplied to a reset signal input terminal R of the flip flop FF'n. In addition, the output terminal Q of the flip flop FF'n is connected to an signal input terminal of one of the AND circuits 11, and then, the inverted output terminal $\overline{Q}$ is connected to a signal input terminal of one of the AND circuits 12. A drive clock signal CK' is supplied to a signal input terminal of the other one of the AND circuits 11, and then, a drive clock signal is supplied via the inverter circuit 13 to a signal input terminal of the other one of the AND circuits 12. Then, connection is established such that an output of the AND circuit 11 is supplied to a gate electrode of the first MOS transistor T1$n$ that configures the push/pull circuit, and an output of the AND circuit 12 is supplied to a gate electrode of the second MOS transistor T2$n$.

In an operation of the signal holding section FFPn in the present embodiment, as shown in the timing chart of FIG. 3B, first, a high level input signal IN is supplied to the set signal input terminal S of the flip flop FF'n, whereby the flip flop FF'n is set, a high level signal is outputted from the output terminal Q thereof, and a low level signal is outputted from the inverted output terminal $\overline{Q}$. In this manner, a high level signal is supplied to a signal input terminal of one of the AND circuits 11, and then, a low level signal is supplied to a signal input terminal of one of the AND circuit 12. At this time, the drive clock signal (second clock signal) CK' is obtained at a low level. Thus, a low level signal is supplied to a signal input terminal of the other one of the AND circuits 11, and a high level signal is supplied to a signal input terminal of the other one of the AND circuits 12. Thus, an output of the AND circuit 11 is obtained at a low level, and an output of the AND circuit 12 is obtained at a high level.

Then, if a drive clock signal CK' rises and is obtained at a high level while an input signal IN is obtained at a high level, a high level signal is supplied to a signal input terminal of the other one of the AND circuits 11, and then, a low level signal is supplied to a signal input terminal of the other one of the AND circuits 12. Thus, an output of the AND circuit 11 is obtained at a high level, and an output of the AND circuit 12 is obtained at a low level. In this manner, a high level voltage is applied to a gate electrode of the first MOS transistor T1$n$ of the push/pull circuit; a low level voltage is applied to a gate electrode of the second MOS transistor T2$n$; and then, an output signal OUT taken out from an output terminal at a connection contact between the MOS transistors T1$n$ and T2$n$ is obtained as a signal whose level is responsive to an output clock signal CK.

Thereafter, when a reset signal RST is obtained at a high level, the flip flop FF'n is reset, a low level signal is outputted from the output terminal Q thereof, and a high level signal is outputted from the inverted output terminal $\overline{Q}$. In this manner, a low level signal is supplied to a signal input terminal of one of the AND circuits 11, and a high level signal is supplied to a signal input terminal of one of the AND circuits 12. An output of the AND circuit 11 is obtained at a low level, an output of the AND circuit 12 is obtained at a high level, and then, an output signal OUT from an output terminal is obtained at a low level.

As described above, in this exemplary construction as well, as is the case with the construction shown in FIG. 1A, construction is provided as follows. By using an output clock signal CK and the other drive clock signal CK' as clock signals, a timing at which the drive clock signal CK' is obtained at a high level is delayed more significantly than a timing at which an input signal IN is obtained at a high level. Then, the first MOS transistor T1$n$ of the push/pull circuit is turned ON when the input signal IN and the drive clock signal CK1 both are obtained at a high level, whereby a time for which a voltage is applied to a gate electrode of the first MOS transistor T1$n$ of the push/pull circuit can be set at a time D2 that is shorter than a conventional time D1 shown in FIG. 8B. In this manner, deterioration of the first MOS transistor T1$n$ of the push/pull circuit can be suppressed.

Now, a description will be given with respect to an example of a specific circuit construction, for achieving a signal holding section that configures a shift register circuit according to the present embodiment.

Figure 4A:
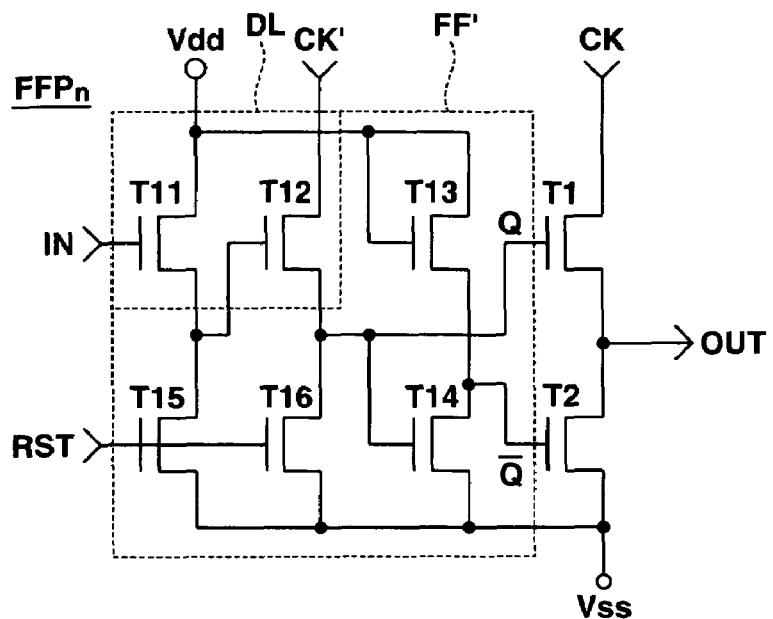
FIG. 4A is a circuit diagram showing an example of a specific construction of the signal holding section according to the present embodiment.

FIG. 4A is a circuit diagram depicting an example of a specific construction of a signal holding section according to the present embodiment.

Figure 4B:
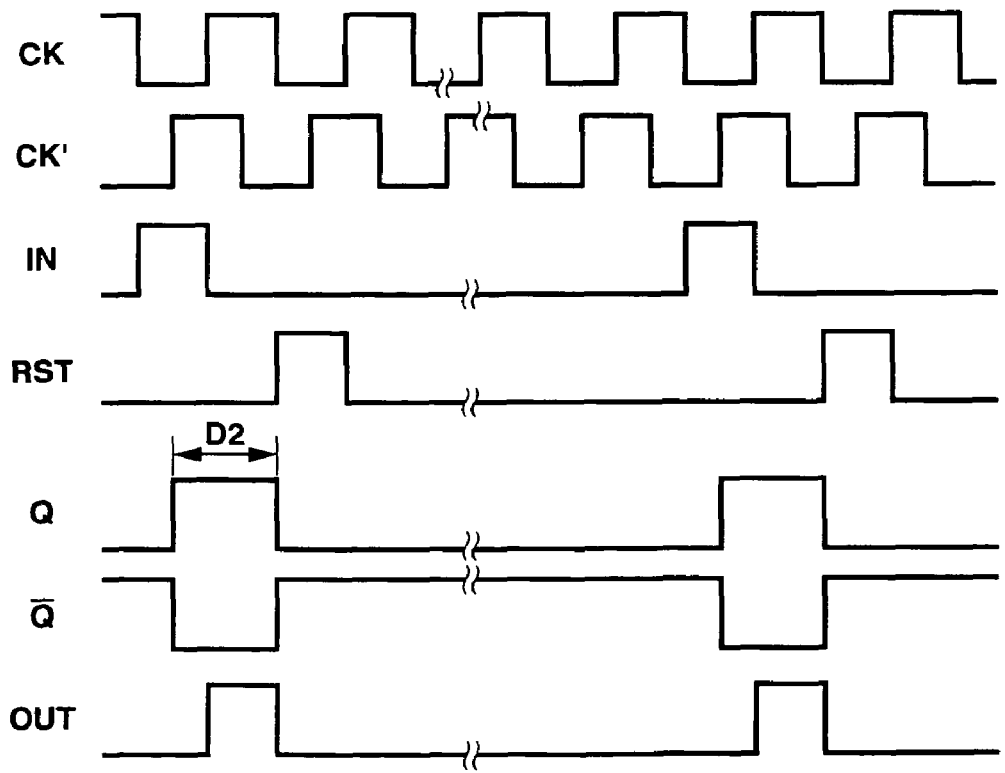
FIG. 4B is a timing chart for explaining an operation of the signal holding section of FIG. 4A.

FIG. 4B is a timing chart for explaining an operation of the signal holding section in FIG. 4A.

In FIG. 4A, reference numerals of a plurality of MOS transistors that configure the signal holding section are illustratively shown while script "n" is omitted for the sake of simplification. In the following description as well, the script is omitted.

The signal holding sections FFPn each are primarily configured to have: a first MOS transistor T1 and a second MOS transistor T2 that configure the push/pull circuit described above; and six MOS transistors T11 to T16. The MOS transistors T11 to T16 each configure a function similar to that of the AND circuit and the set/reset type flip flop described above. In addition, the first and second MOS transistors T1 and T2 that configure the push/pull circuit form an output circuit in the present invention.

Here, the MOS transistor T11 forms a third transistor in the present invention; the MOS transistor T12 forms a fourth transistor; the MOS transistor T15 form a fifth transistor; the MOS transistor T16 forms a sixth transistor; and the MOS transistor T14 forms a seventh transistor.

In the MOS transistor T11 that is the third transistor, a gate electrode is connected to a signal input terminal (first signal input terminal) supplied with an input signal IN, and a drain electrode is connected to a high electric potential power supply Vdd that serves as an operating voltage at a high electric potential side. In addition, a source electrode of this MOS transistor T11 is connected to a gate electrode of the MOS transistor T12 that is the fourth transistor.

A drain electrode of the MOS transistor T12 is connected to a second clock signal input terminal, and a drive clock signal (second clock signal) CK' having a predetermined timing relationship with an output clock signal (first clock signal) CK is supplied thereto, as shown in FIG. 2 described previously. In addition, a source electrode of this MOS transistor T12 is connected to a gate electrode of the first MOS transistor T1.

Further, the source electrode of this MOS transistor T12 is diode-connected to the high electric potential power supply Vdd, and is connected to a gate electrode of the MOS transistor T14 that is the seventh transistor whose drain and source electrodes are connected between the MOS transistor T13 functioning as a load and a low electric potential power supply Vss serving as an operating voltage obtained at a low electric potential side. Then, a drain electrode of this MOS transistor T14 is connected to the gate electrode of the second MOS transistor T2.

In addition, in the MOS transistor T15 that is the fifth transistor, a gate electrode is connected to a reset signal input terminal (second signal input terminal) supplied with a reset signal RST; a drain electrode is connected to a source electrode of the MOS transistor T11; and a source electrode is connected to the low electric potential power supply Vss. In addition, in the MOS transistor T16 that is the sixth transistor, a gate electrode is connected to a second signal input terminal RST supplied with a reset signal RST; a drain electrode is connected to a source electrode of the MOS transistor T12; and a source electrode is connected to the low electric potential power supply Vss.

The circuit construction shown in FIG. 4A is equivalent to the block diagram of the signal holding section explained in FIG. 1A described previously; the MOS transistors T11 and T12 each have a function equivalent to that of the AND circuit 10 of FIG. 1A; and the MOS transistors T13 to T16 each have a function equivalent to that of the set/reset type flip flop FF'n of FIG. 1A. In addition, a source electrode of the MOS transistor T12 is equivalent to the output terminal Q of the flip flop FF'n of FIG. 1A, and a drain electrode of the MOS transistor T14 is equivalent to the inverted output terminal $\overline{Q}$ of the flip flop FF'n of FIG. 1A.

Here, all of the above eight MOS transistors T1, T2, and T11 to T16 are composed of n-channel type amorphous silicon TFTs.

Now, an operation of the thus constructed signal holding section FFPn will be described with reference to the timing chart of FIG. 4B.

First, a high level input signal IN is supplied to a signal input terminal (first signal input terminal) connected to a gate electrode of the MOS transistor T11. In this manner, the MOS transistor T11 is turned ON. A high electric potential power supply Vdd is supplied to a drain electrode of this MOS transistor T11, and thus, an electric potential of a source electrode of the MOS transistor T11 rises due to the turning ON of the MOS transistor T11. In this manner, an electric potential of a gate electrode of the MOS transistor T12 connected to the source electrode of the MOS transistor T11 rises, and then, this MOS transistor T12 is turned ON.

The drain electrode of the MOS transistor T12 is connected to a second clock signal input terminal, and a drive clock signal (second clock signal) CK' is supplied thereto. Then, an input signal IN is obtained at a high level. The drive clock signal CK' is obtained at a low level at a timing at which the MOS transistor T11 is turned ON, and thus, the source electrode (equivalent to output terminal Q) of the MOS transistor T12 is also obtained at a low level. In this manner, the gate electrode of the first MOS transistor T1 connected to the source electrode of the MOS transistor T12 is also obtained at a low level. In this manner, the first MOS transistor T1 is turned OFF.

In addition, a gate electrode of the MOS transistor T14 connected to the source electrode of the MOS transistor T12 is also obtained at a low level. In this manner, the MOS transistor T14 also is turned OFF. Therefore, a drain electrode (equivalent to inverted output terminal $\overline{Q}$) of the MOS transistor T14 is obtained at a high level by means of a high electric potential power supply Vdd via the MOS transistor T13 that functions as a diode (load), and then, the gate electrode of the second MOS transistor T2 connected to the drain electrode of the MOS transistor T14 is also obtained at a high level. In this manner, the second MOS transistor T2 is turned ON.

Therefore, an output signal taken out from an output terminal OUT at a connection contact between the first and second MOS transistors T1 and T2 is obtained at a low level equivalent to a low electric potential power supply Vss supplied to the source electrode of the second MOS transistor T2.

Then, while an input signal IN is obtained at a high level, a drive clock signal CK' rises, and is obtained at a high level. Then, a high level drive clock signal CK' is supplied to the drain electrode of the MOS transistor T12. At this time, the MOS transistor T12 is turned ON, and thus, the source electrode (output terminal Q) of this MOS transistor T12 is obtained at a high level. In this manner, the gate electrode of the first MOS transistor T1 and the gate electrode of the MOS transistor T14 each are obtained at a high level, and then, the MOS transistors T1 and T14 are turned ON.

When the MOS transistor T14 is turned ON, a current path from a high electric potential power supply Vdd to a high electric potential power supply Vdd via the MOS transistors T13 and T14 is configured, and then, the drain electrode (inverted output terminal $\overline{Q}$) of the MOS transistor 14 is lowered. Thus, the gate electrode of the second MOS transistor T2 is obtained at a low level. In this manner, the second MOS transistor T2 is turned OFF.

Therefore, the output signal OUT taken out from an output terminal at a connection contact between the first and second MOS transistors T1 and T2 is outputted as a signal whose level is responsive to an output clock signal (first clock signal) CK supplied to a second clock signal input terminal connected to the drain electrode of the first MOS transistor T1. That is, while the output clock signal CK is obtained at a low level, the output signal OUT is obtained at a low level.

In addition, when the output clock signal CK is obtained at a high level, the output signal OUT is obtained at a high level. At this time, a low level input signal IN is supplied to the gate electrode of the MOS transistor T11. However, an electric charge is held for a predetermined period due to a parasitic capacitance of the gate electrode of the MOS transistor T11. Thus, an OFF state is not established immediately; an ON state is held for the predetermined period described above, and then, an OFF state is established. Therefore, during the predetermined period, the ON states of the MOS transistors T11, T12, and T14 are maintained. In this manner, the gate electrode of the first MOS transistor T1 is maintained at a high level, the gate electrode of the second MOS transistor T2 is maintained at a low level, and the output signal OUT is obtained at a high level.

Thereafter, when a low level drive clock signal CK' is supplied to the drain electrode of the MOS transistor T12, an electric charge is held for a predetermined period due to a parasitic capacitance of the gate electrodes of the MOS transistors T14 and T1. Thus, these MOS transistors T14 and T1 are not turned OFF immediately; an ON state is held for the predetermined period described above, and then, an OFF state is established. Therefore, during the predetermined period, the ON states of these MOS transistors T14 and T1 are maintained. In this manner, the output signal OUT is maintained at a high level.

Then, when a high level reset signal RST is supplied to a second signal input terminal connected to gate electrodes of the MOS transistors T15 and T16, these MOS transistors T15 and T16 are turned ON. In this manner, the drain electrode of the MOS transistor T15 and the drain electrode (output terminal Q) of the MOS transistor T16 each are obtained at a low level, the electric charge held on the gate electrodes of the MOS transistors T12, T14, and T1 is rapidly discharged, and then, these MOS transistors T12, T14, and T1 are turned OFF. Therefore, the output signal OUT is obtained at a low level.

While each MOS transistor is of n-channel type in the above description, it may be of p-channel type as long as ON/OFF operation of such each MOS transistor is made in the same manner as that described above. Further, this MOS transistor may include both of n-channel type and p-channel type. In that case, the level of such each signal is properly set so that the ON/OFF operation of each MOS transistor is made in the same manner as that described above.

As described above, in the signal holding section FFPn in the present embodiment, as in the construction shown in FIG. 1A, a timing at which a drive clock signal CK' is obtained at a high level is delayed more significantly than a timing at which an input signal IN is obtained at a high level, by using two clock signals, i.e., an output clock signal (first clock signal) CK and a drive clock signal CK' (second clock signal). In this manner, a time for which a voltage is applied to the gate electrode of the first MOS transistor T1$n$ that configures a push/pull circuit can be set at a time D2 that is shorter than that in the case of a conventional construction. Therefore, deterioration of the first MOS transistor T1$n$ of the push/pull circuit can be suppressed.

Now, a description will be given with respect to a construction of a shift register circuit configured by cascade-connecting a plurality of signal holding sections according to the present embodiment.

Figure 5:
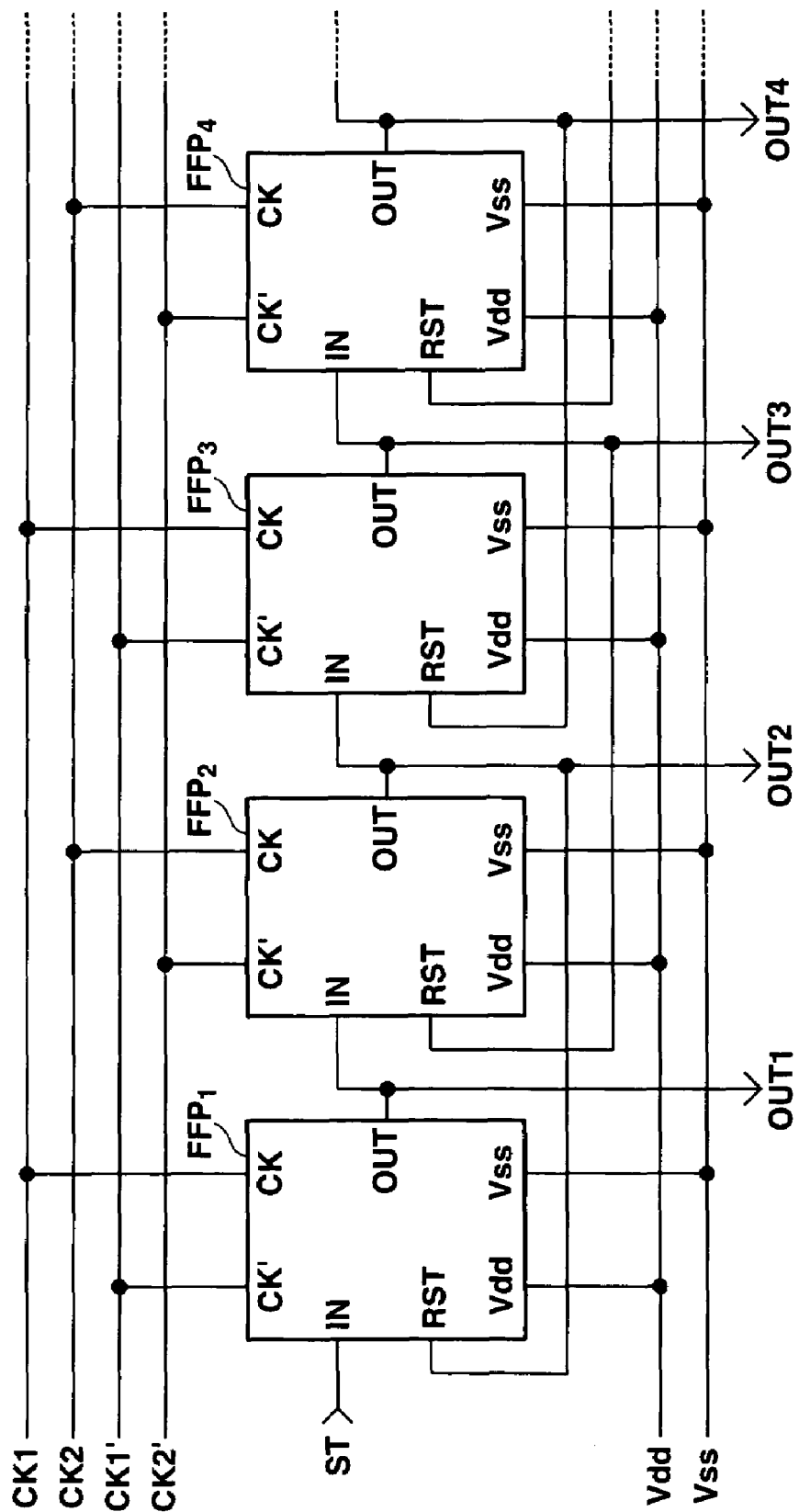
FIG. 5 is a circuit diagram showing an exemplary configuration of a shift register circuit using the signal holding section according to the present embodiment.

FIG. 5 is a circuit diagram showing an exemplary configuration of a shift register circuit using the signal holding section according to the present embodiment.

Figure 6:
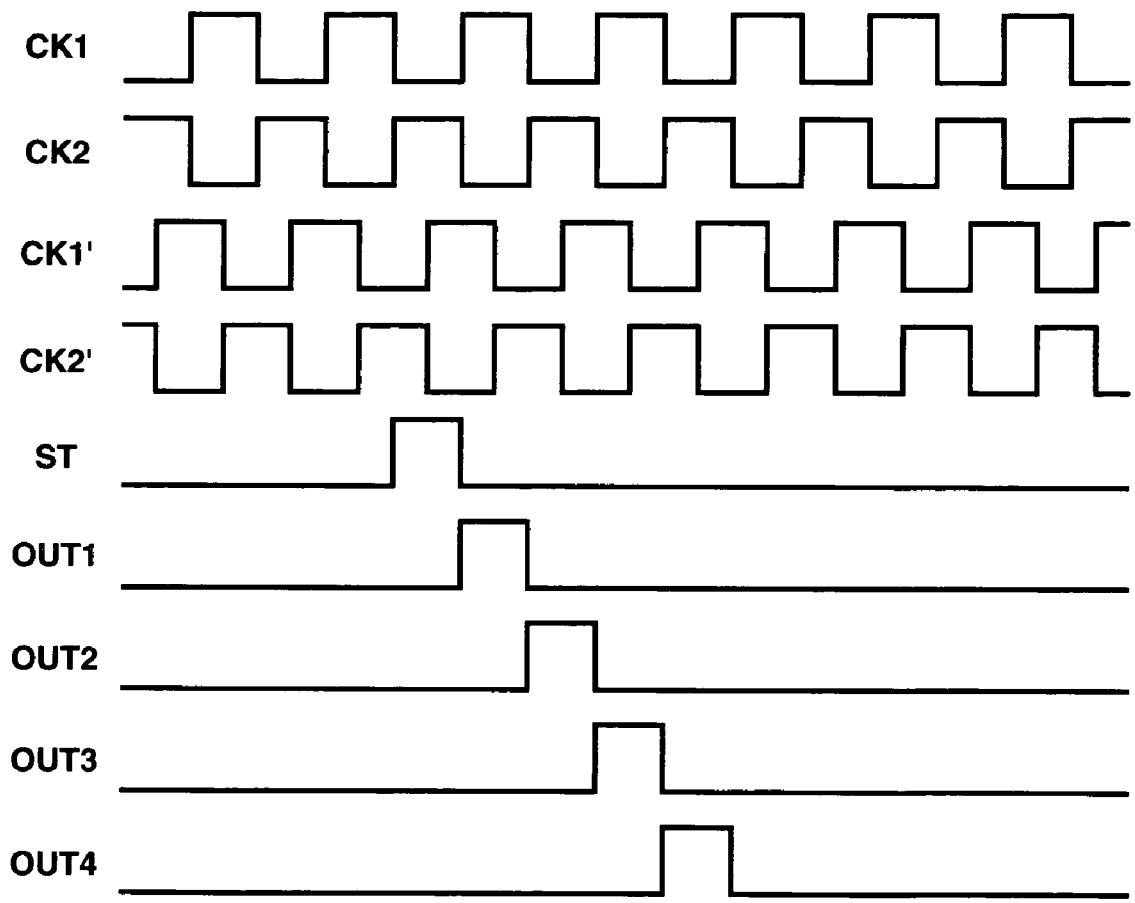
FIG. 6 is a timing chart for explaining an operation of the shift register circuit of FIG. 5.

FIG. 6 is a timing chart for explaining an operation of the shift register circuit of FIG. 5.

As shown in FIG. 5, the shift register circuit according to the present invention is configured by cascade-connecting in series a plurality of signal holding sections FFPn shown in FIGS. 1A, 3A, and 4A.

That is, an output signal OUTn of a signal holding section FFPn of an n-th stage is externally taken out and the resulting signal is supplied as an input signal IN to a signal input terminal (first signal input terminal) of a signal holding section FFPn+1 of an n+1-th stage. In addition, connection is established such that an output signal OUTn+1 from the signal holding section FFPn+1 of the n+1-th stage is fed back as a reset signal RST to a reset signal input terminal (second signal input terminal) of the signal holding section FFPn of the n-th stage. Here, a predetermined start signal ST is supplied to a signal input terminal of a signal holding section FFP1 of a first stage. In addition, a reset signal is externally supplied to a reset signal input terminal of a flip flop FFn of a signal holding section of a final stage.

In addition, for example, in the case where "m" output stages are required for the shift register circuit, signal holding sections for m+1 stages are used, and a signal holding section of the final stage is used as a dummy section so that an output signal OUT of its final stage may be supplied as a reset signal RST to a reset signal input terminal of a signal holding section of an m-th stage without externally outputting the output signal OUT.

In addition, a configuration is provided such that, to the odd-numbered signal holding sections FFP1, FFP3, ..., a first output clock signal CK1 and a first drive clock signal CK1' that meets the condition as described above with respect to the first output clock signal are supplied as an output clock signal (first clock signal) CK and a drive clock signal (second clock signal) CK', respectively. In addition, to the even-numbered signal holding sections FFP2, FFP4, ..., a second output clock signal CK2 having an inverted waveform of the above first output clock signal CK1 and a second drive clock signal CK2' that meets the condition described above with respect to the second output clock signal are supplied as an output clock signal CK and a drive clock signal CK', respectively.

According to the thus constructed shift register circuit, as in the case of the conventional shift register circuit and as shown in the timing chart of FIG. 6, after the start signal is supplied, high level output signals OUT1, OUT2, OUT3, OUT4, ... are sequentially transferred (shifted), and then outputted in synchronism with a high level applying timing of pulse signals CK1 and CK2.

As described above, in the shift register according to the present invention, the other drive clock signal CK1 is used as a clock signal in addition to an output clock signal CK, and a timing at which the drive clock signal CK' is obtained at a high level is delayed more significantly than a timing at which an input signal IN is obtained at a high level. In this manner, a period for which a voltage is applied to a gate electrode of the first MOS transistor T1 of a push/pull circuit can be reduced more remarkably than conventionally, deterioration with time of the MOS transistor T1 can be suppressed, and long-term reliability of the shift register circuit can be improved.

Now, an application example of a shift register circuit according to the present invention will be specifically described with reference to the accompanying drawings.

Figure 7A:
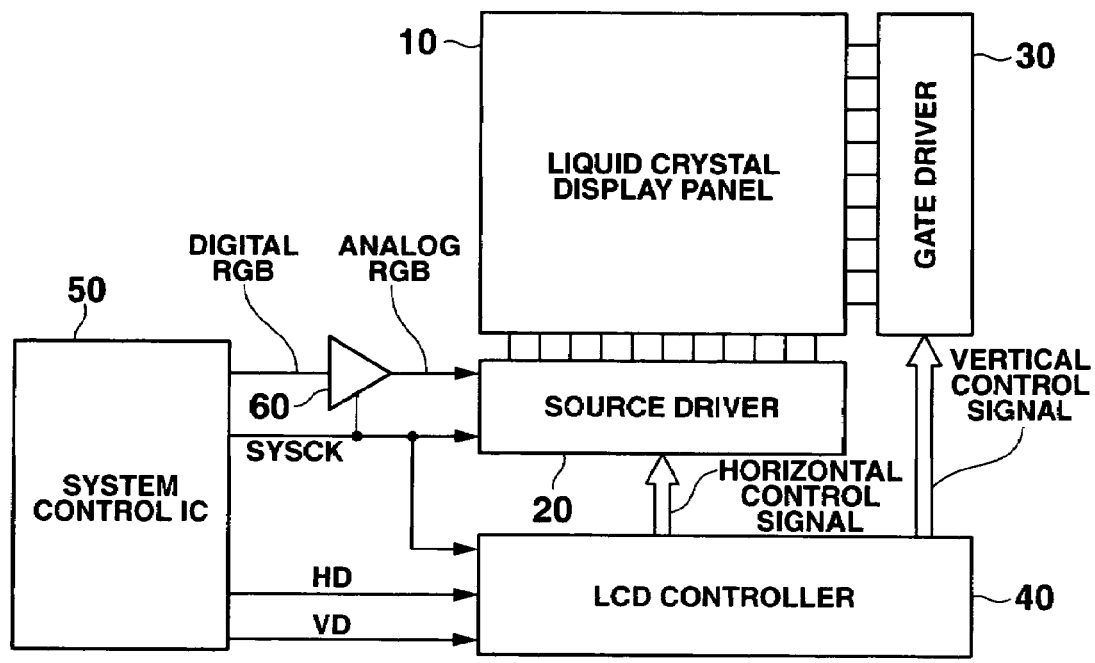
FIG. 7A is a schematic view showing a whole construction of a liquid crystal display device to which the shift register circuit according to the present invention is applied.

FIG. 7A is a schematic diagram showing a whole construction of a liquid crystal display device to which the shift register circuit according to the present invention is applied.

Figure 7B:
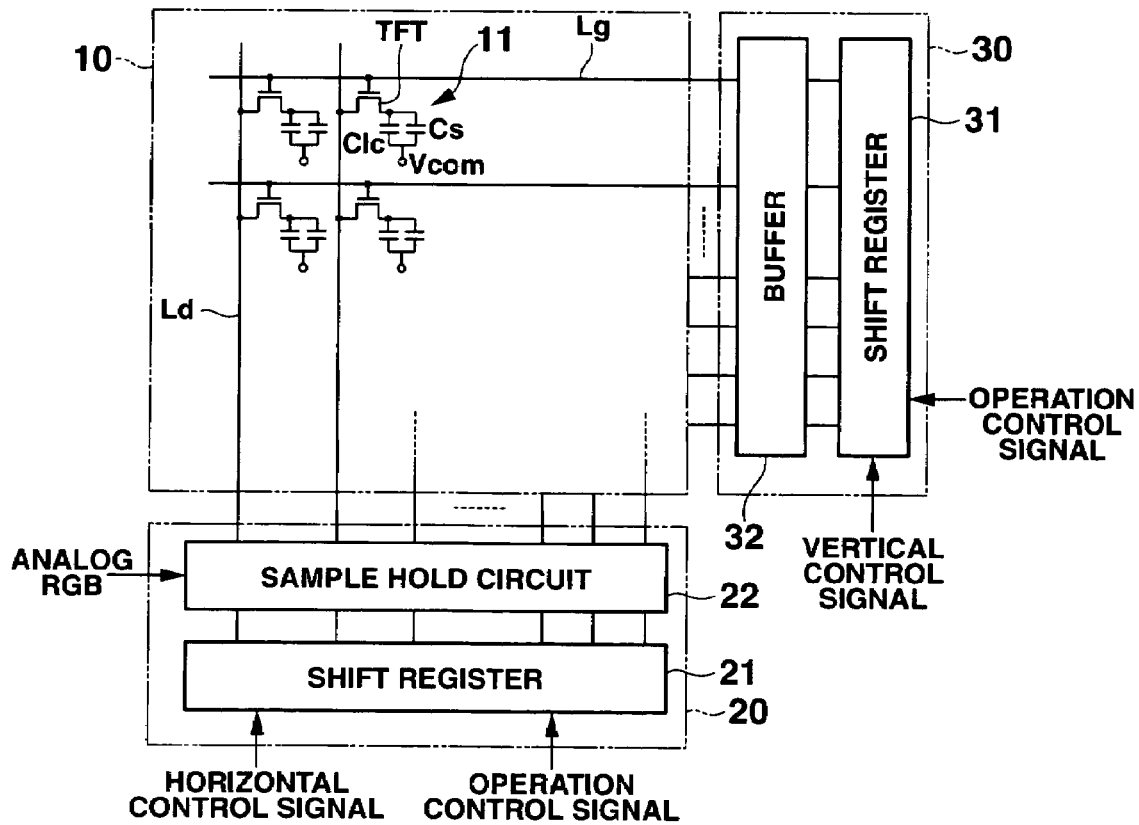
FIG. 7B is a detailed view showing a construction of essential portions of the liquid crystal display device according to this application example.

FIG. 7B is a detailed view showing a configuration of essential portions of the liquid crystal display device according to this application example.

Here, a description will be given with respect to a liquid crystal display device using an active matrix type liquid crystal display panel as a liquid crystal display device.

As shown in FIG. 7A, the liquid crystal display device according to this application example is roughly configured to have: a liquid crystal display panel (display means) 10; a source driver (signal driver; display drive device) 20; a gate driver (scan driver; display drive device) 30; an LCD controller 40; a system control circuit 50; and a digital/analog converter (hereinafter, referred to as a D/A converter) 60.

Now, a description of the constituent elements will be given below. The liquid crystal display panel 10, as shown in FIG. 7B, is configured to have: a liquid crystal capacitance Clc made of: pixel electrodes disposed in a matrix shape and a common electrode (common voltage Vcom) disposed in opposite to the pixel electrodes; and a liquid crystal charged between the pixel electrode and the common electrode; a TFT whose source is connected to the pixel electrode (hereinafter, referred to as a "pixel transistor TFT"); a scan line Lg extending in a row direction of the matrix and connected to a gate of a plurality of pixel transistors TFTs; and a signal line Ld extending to a columnar direction of the matrix and connected to a drain of a plurality of pixel transistors TFTs.

Then, a signal voltage is applied to a pixel electrode selected by means of the source driver 20 and the gate driver 30 described later, thereby controlling arrangement of liquid crystals, and displaying and outputting predetermined image information. Here, Cs is a charged capacitance, and the liquid crystal capacitance Clc, the charged capacitance Cs, and the pixel transistor TFT configure a liquid crystal pixel (display pixel) 11.

The source driver 20 supplies signal voltages that correspond to image signals R, G, and B to pixel electrodes via the signal line Ld, based on a horizontal control signal supplied from the LCD controller 40 described later.

Here, the source driver 20, as shown in FIG. 7B, is schematically configured to have: a sample hold circuit 22 inputted with R, G, and B image signals; and a shift register 21 for controlling a sample hold operation of the sample hold circuit 22. The sample hold control signals shifted and outputted in a predetermined direction by means of the shift register 21 are sequentially applied to the sample hold circuit 22, whereby the signal voltages that correspond to the applied R, G, and B image signals are sent out to the signal lines Ld of the liquid crystal display panel 10.

On the other hand, in the gate driver 30, scan signals are sequentially applied to the scan lines Lg, and are made active, based on a vertical control signal supplied from the LCD controller 40. Then, the source driver 20 performs line sequential driving of applying (writing) a signal voltage, supplied to the signal line Ld, to the pixel electrode (display pixels) disposed at a position crossing the signal line Ld.

The gate driver 30, as shown in FIG. 7B, is schematically configured to have a shift register 31 and a buffer 32. Control signals sequentially shifted and outputted in a predetermined direction by means of the shift register 31 are sequentially applied to the scan lines Lg of the liquid crystal display panel 10 as a predetermined gate signal, whereby pixel transistors ITFT are driven and controlled, and the signal voltages applied to the signal lines Ld by means of the source driver 20 are applied to pixel electrodes via the pixel transistor TFT.

The LCD controller 40 generates a horizontal control signal and a vertical control signal based on a horizontal sync signal HD, a vertical sync signal VD, and a system clock SYSCK supplied from the system control circuit 50. Then, the generated control signals are supplied to the source driver 20 and the gate driver 30, respectively, thereby carrying out control of applying a signal voltage to a pixel electrode at a predetermined timing, and displaying desired image information on the liquid crystal display panel 10.

The system control circuit 50 supplies the system clock SYSCK to the source driver 20, the LCD controller 40, the D/A converter 60 and the like and supplies to the LCD controller 40 the horizontal sync signal HD and the vertical sync signal VD synchronized with this system clock SYSCK. In addition, video image signals made of digital RGB signals are outputted to the source driver 20 as analog RGB signals (image signals R, G, and B) via the D/A converter 60.

That is, the LCD controller 40 and the system control circuit 50 each configure a drive control signal generating device which generates a variety of control signals for displaying desired image information on the liquid crystal display panel 10, based on a video image signal externally supplied via an interface (not shown), and then, outputting the generated control signals to the source driver 20 and the gate driver 30.

In the liquid crystal display device having the configuration described above, the shift register circuit (FIG. 5) according to the present invention can be properly applied as a shift register 21 provided in the source driver 20 and a shift register 31 provided in the gate driver 30. That is, based on output clock signals CK1 and CK2 and drive clock signals CK1' and CK2', each of which has a predetermined cycle, the output signals OUTn each sequentially outputted from the signal holding sections FFPn (FIGS. 1A, 3A, and 4A) described above can be utilized as a sample hold control signal or a control signal outputted to the buffer 32.

Here, in the shift registers 21 and 31, operation control signals (output clock signals CK1 and CK2, drive clock signals CK1' and CH2', and start signal ST) for executing an operation similar to that of the shift register circuit according to the present invention can be configured so as to be generated and outputted by means of the LCD controller 40, for example. In addition, the output clock signals CK1 and CK2 and the drive clock signals CK1' and CK2' may be generated with a configuration in which only the start signal ST is generated and outputted by means of the LCD controller 40, and the illustration of the source driver 20 and the gate driver 30 is omitted.

With application of such a shift register circuit according to the present invention to a liquid crystal display device, when the shift registers 21 and 31 are operated in a shifted manner and the above line sequential driving is executed, a period for which a voltage is applied to a gate electrode of a first MOS transistor T1 that configures a push/pull circuit of the shift registers 21 and 31 can be reduced more remarkably than conventionally. In this manner, deterioration of the MOS transistor T1 can be suppressed. Further, there can be provided a liquid crystal display device capable of improving the long-term reliability of the shift register circuit and reducing a malfunction or deterioration of display characteristics for a long period of time.

In addition, the drive circuits such as the source driver 20 and the gate driver 30 configured by the shift registers 21 and 31 can be integrally formed on a substrate (TFT substrate) of the display panel 10 by means of an amorphous silicon TFT, and reduction in cost and thickness of the liquid crystal display device can be promoted.

While the present invention has been described by way of one embodiment, the present invention is not limited to such one embodiment described above. Of course, various modifications or applications can be made without departing from the spirit of the invention.

For example, the circuit construction shown in FIG. 4A is provided as an example for achieving functions of the present invention. As long as like functions can be achieved, there is no need for a circuit system, namely, the number of transistors or its connection may be different.

In addition, the transistor may be of p-channel type without being limited to an n-channel type amorphous silicon TFT. Further, a poly-silicon TFT having the same electric conductivity or ZnO-TFT and the like having the same electric conductivity may be used.

What is claimed is:

1. A shift register circuit comprising:
   plural stages of signal holding circuits which are cascade-connected to hold a first signal based on a supplied input signal, to output an output signal based on the held first signal based on the supplied input signal, and to supply the output signal as the input signal to a subsequent stage;
   each of the plural stages of signal holding circuits comprising:
   an output circuit which: (i) is supplied with two types of clock signals comprising a first clock signal and a second clock signal, wherein a rise timing of the second clock signal is between a fall timing of the first clock signal and a rise timing thereof, (ii) is supplied with the input signal in synchronization with the fall timing of the first clock signal, (iii) is supplied with a second signal at a timing delayed by a delay time from a timing of applying the input signal to the rise timing of the second clock signal, and (iv) outputs the output signal at a timing in response to the first clock signal.

2. The shift register circuit according to claim 1, wherein each of the plural stages of signal holding circuits is supplied with a reset signal for resetting the held signal which is the output signal outputted from the subsequent stage.

3. The shift register circuit according to claim 2, wherein each of the plural stages of signal holding circuits further comprises a latch circuit which holds the input signal at a timing delayed by the delay time in response to the second clock signal and resets the held signal in response to the reset signal, and
   wherein the output circuit outputs the signal held in the latch circuit as the output signal at the timing in response to the first clock signal.

4. The shift register circuit according to claim 2, wherein each of the plural stages of signal holding circuits further comprises a latch circuit which holds the input signal and resets the held signal in response to the reset signal, and
   wherein the output circuit outputs the signal held in the latch circuit as the output signal at the timing delayed by the delay time in response to the first clock signal.

5. The shift register circuit according to claim 2, wherein the reset signal is a signal applied at a timing at which an inverted phase of the first clock signal is obtained.

6. The shift register circuit according to claim 2, wherein the reset signal is the output signal outputted from the signal holding circuit of a next stage.

7. The shift register circuit according to claim 2, wherein the output circuit has at least one transistor, and
   wherein the transistor is turned ON only between a timing delayed by the delay time from the timing of applying the input signal and a timing at which the reset signal is applied.

8. The shift register circuit according to claim 1, wherein, among the plural stages of signal holding circuits, the two types of clock signals applied to the signal holding circuits of even-numbered stages are signals obtained by inverting the two types of clock signals applied to the signal holding circuits of odd-numbered stages.

9. The shift register circuit according to claim 1, wherein the second clock signal is a signal obtained by shifting a phase of the first clock signal so that the rise timing thereof is delayed.

10. The shift register circuit according to claim 1, wherein a fall timing of the second clock signal is identical to or earlier than the fall timing of the first clock signal.

11. The shift register circuit according to claim 2, wherein the output circuit comprises:
an output terminal which outputs the output signal;
a first transistor having a drain electrode to which the first clock signal is applied and a source electrode connected to the output terminal; and
a second transistor having a drain electrode connected to the output terminal and a source electrode connected to a low electric potential power supply, and
wherein between a timing delayed by the delay time from the timing of applying the input signal and a timing at which the reset signal is applied, a drive signal for turning ON the first transistor is supplied to a gate electrode of the first transistor, and an inverted signal of the drive signal is supplied to a gate electrode of the second transistor.

12. The shift register circuit according to claim 11, wherein each of the plural stages of signal holding circuits comprises:
a first clock signal input terminal supplied with the first clock signal;
a second clock signal input terminal supplied with the second clock signal;
a first signal input terminal applied with the input signal;
a second signal input terminal applied with a reset signal which is the output signal outputted from the subsequent stage;
a third transistor having a gate electrode connected to the first signal input terminal and a drain electrode connected to a high electric potential power supply;
a fourth transistor having a gate electrode connected to a source electrode of the third transistor, a drain electrode connected to the second clock signal input terminal, and a source electrode connected to a gate electrode of the first transistor;
a fifth transistor having a gate electrode connected to the second signal input terminal, a drain electrode connected to a gate electrode of the fourth transistor, and a source electrode connected to a low electric potential power supply; and
a sixth transistor having a gate electrode connected to the second signal input terminal, a drain electrode connected to a gate electrode of the first transistor, and a source electrode connected to the low electric potential power supply.

13. The shift register circuit according to claim 1, wherein the signal holding circuit is formed of a plurality of field-effect transistors having single electric conductivity.

14. The shift register circuit according to claim 13, wherein the field-effect transistor is an amorphous silicon thin-film transistor.

15. A shift register circuit comprising:
plural stages of signal holding circuits which are supplied with an input signal, and are cascade-connected to output an output signal based on the input signal and to supply the output signal as an input signal to a subsequent stage,
wherein each of the plural stages of signal holding circuits is supplied with two types of clock signals comprising a first clock signal and a second clock signal, wherein a rise timing of the second clock signal between the fall timing of the first clock signal to the rise timing thereof, a reset signal, and is supplied with the input signal in synchronization with the fall timing of the first clock signal, and wherein each of the plural stages of signal holding circuits comprises:
(i) a latch circuit which holds the input signal at a timing delayed by a delay time from the timing of applying the input signal to the rise timing of the second clock signal in response to the second clock signal and resets the held input signal in response to the reset signal; and
(ii) an output circuit which outputs the held input signal as the output signal at a timing in response to the first clock signal.

16. The shift register circuit according to claim 15, wherein the output circuit has at least one transistor, and
wherein the transistor is turned ON only between a timing delayed by the delay time from the timing of applying the input signal and a timing at which the reset signal is applied.

17. A shift register circuit comprising:
plural stages of signal holding circuits which are supplied with an input signal, and are cascade-connected to output an output signal based on the input signal and to supply the output signal as the input signal to a subsequent stage,
wherein each of the plural stages of signal holding circuits is supplied with two types of clock signals comprising a first clock signal and a second clock signal, wherein a rise timing of the second clock signal is between the fall timing of the first clock signal and the rise timing thereof, a reset signal, and is supplied with the input signal in synchronization with the fall timing of the first clock signal and wherein each of the plural stages of signal holding circuits comprises:
(i) a latch circuit which holds the input signal and resets the held input signal in response to the reset signal; and
(ii) an output circuit which outputs the held input signal as the output signal wherein the held signal is supplied to the output circuit at a timing delayed by the delay time from the timing of applying the input signal to the rise timing of the second clock signal, at a timing delayed by the delay time from the timing of applying the input signal to the rise timing of the second clock signal in response to the second clock signal.

18. The shift register circuit according to claim 17, wherein the output circuit has at least one transistor, and
wherein the transistor is turned ON only between a timing delayed by the delay time from the timing of applying the input signal and a timing at which the reset signal is applied.

19. A display drive device which outputs a signal for displaying a desired image to a display panel having a plurality of display pixels in a matrix shape, the display drive device comprising:
a shift register circuit which sequentially outputs control signals for outputting the signal, wherein the shift register circuit comprises plural stages of signal holding circuits which are cascade-connected to hold a first signal based on a supplied input signal, to output an output signal based on the held first signal, and to supply the output signal as the input signal to a subsequent stage,
wherein each of the plural stages of signal holding circuits comprises an output circuit which: (i) is supplied with two types of clock signals comprising a first clock signal and a second clock signal, a rise timing of the second clock signal being between a fall timing of the first clock signal to the rise timing thereof, (ii) is supplied with the input signal in synchronization with the fall timing of the first clock signal, (iii) is supplied with a signal at a timing delayed by the delay time from the timing of applying the input signal to the rise timing of the second clock signal, and (iv) outputs the output signal at a timing in response to the first clock signal.

20. The display drive device according to claim 19, wherein each of the plural stages of signal holding circuits is supplied with a reset signal for resetting the held signal which is the output signal outputted from the subsequent stage.

21. The display drive device according to claim 20, wherein the reset signal is the output signal outputted from the signal holding circuit of a next stage.

22. The display drive device according to claim 20, wherein the output circuit has at least one transistor, and
   wherein the transistor is turned ON only between a timing delayed by the delay time from the timing of applying the input signal and a timing at which the reset signal is applied.

23. The display drive device according to claim 19, wherein, among the plural stages of signal holding circuits, the two types of clock signals applied to the signal holding circuits of even-numbered stages are signals obtained by inverting the two types of clock signals applied to the signal holding circuits of odd-numbered stages.

24. The display drive device according to claim 19, wherein the second clock signal is a signal obtained by shifting a phase of the first clock signal so that the rise timing thereof is delayed.

25. The display drive device according to claim 20, wherein the output circuit comprises:
   an output terminal which outputs the output signal;
   a first transistor having a drain electrode to which the first clock signal is applied and a source electrode connected to the output terminal; and
   a second transistor having a drain electrode connected to the output terminal and a source electrode connected to a low electric potential power supply, and
   wherein between a timing delayed by the delay time of the second clock signal from the timing of applying the input signal and a timing at which the reset signal is applied, a drive signal for turning ON the first transistor is supplied to a gate electrode of the first transistor, and an inverted signal of the drive signal is supplied to a gate electrode of the second transistor.

26. The display drive device according to claim 25, wherein each of the plural stages of signal holding circuits comprises:
   a first clock signal input terminal supplied with the first clock signal;
   a second clock signal input terminal supplied with the second clock signal;
   a first signal input terminal applied with the input signal;
   a second signal input terminal applied with a reset signal which is the output signal outputted from the subsequent stage;
   a third transistor having a gate electrode connected to the first signal input terminal and a drain electrode connected to a high electric potential power supply;
   a fourth transistor having a gate electrode connected to a source electrode of the third transistor, a drain electrode connected to the second clock signal input terminal, and a source electrode connected to a gate electrode of the first transistor;
   a fifth transistor having a gate electrode connected to the second signal input terminal, a drain electrode connected to a gate electrode of the fourth transistor, and a source electrode connected to a low electric potential power supply; and
   a sixth transistor having a gate electrode connected to the second signal input terminal, a drain electrode connected to a gate electrode of the first transistor, and a source electrode connected to the low electric potential power supply.

27. The display drive device according to claim 19, wherein the signal holding circuit is formed of a plurality of field-effect transistors having single electric conductivity.

28. The display drive device according to claim 27, wherein the field-effect transistor is an amorphous thin-film transistor.

29. The display drive device according to claim 28, wherein the display drive device is formed on a same substrate as that of the display panel.

30. A shift register circuit comprising:
   plural stages of signal holding circuits which are cascade-connected to hold a first signal based on a supplied input signal, to output an output signal based on the held first signal, and to supply the output signal as the input signal to a subsequent stage;
   wherein each of the plural stages of signal holding circuits comprises an output circuit which: (i) is supplied with two types of clock signals further comprising a first clock signal and a second clock signal, wherein a rise timing of the second clock signal is between a fall timing of the first clock signal and a rise timing thereof, (ii) is supplied with the input signal in synchronization with the fall timing of the first clock signal, (iii) is supplied with a second signal at a timing delayed by a delay time from a timing of applying the input signal to the rise timing of the second clock signal, and (iv) outputs the output signal at a timing in response to the first clock signal;
   wherein the output circuit has at least one transistor, and the transistor is turned ON only between a timing delayed by the delay time from the timing of applying the input signal and a timing at which the reset signal is applied.

* * * * *